United States Patent
Jones (10) Patent No.: US 10,968,518 B2
(45) Date of Patent: Apr. 6, 2021

(54) CARBON OVERCOAT SURFACE TREATMENT

(71) Applicant: SEAGATE TECHNOLOGY LLC, Cupertino, CA (US)

(72) Inventor: Paul M. Jones, Palo Alto, CA (US)

(73) Assignee: SEAGATE TECHNOLOGY LLC, Fremont, CA (US)

(*) Notice: Subject to any disclaimer, the term of this patent is extended or adjusted under 35 U.S.C. 154(b) by 132 days.

(21) Appl. No.: 16/236,197

(22) Filed: Dec. 28, 2018

(65) Prior Publication Data

US 2020/0208269 A1   Jul. 2, 2020

(51) Int. Cl.
| | |
|---|---|
| *C23C 16/56* | (2006.01) |
| *C23C 16/26* | (2006.01) |
| *C23C 14/06* | (2006.01) |
| *G11B 5/733* | (2006.01) |
| *G11B 5/00* | (2006.01) |

(52) U.S. Cl.
CPC .......... *C23C 16/56* (2013.01); *C23C 14/0605* (2013.01); *C23C 16/26* (2013.01); *G11B 5/733* (2013.01); *G11B 2005/0021* (2013.01)

(58) Field of Classification Search
CPC ...... C23C 16/26; C23C 16/56; C23C 14/0605
See application file for complete search history.

(56) References Cited

U.S. PATENT DOCUMENTS

| | | | |
|---|---|---|---|
| 6,136,403 A | 10/2000 | Prabhakara et al. | |
| 6,878,405 B2 * | 4/2005 | Bienkiewicz | C03C 17/22 |
| | | | 427/249.7 |
| 6,946,191 B2 | 9/2005 | Morikawa et al. | |
| 9,196,282 B2 * | 11/2015 | Sato | G11B 5/8408 |
| 10,121,506 B1 | 11/2018 | Xu et al. | |

* cited by examiner

*Primary Examiner* — Michael P Wieczorek
(74) *Attorney, Agent, or Firm* — Holzer Patel Drennan (57) ABSTRACT

Systems and methods for treating a carbon overcoat surface are described. In one embodiment, the method may include depositing a magnetic recording layer over a substrate, depositing a carbon overcoat layer over the magnetic recording layer, and exposing a carbon overcoat layer to water in gas phase after the carbon overcoat layer is deposited on the magnetic recording layer. In some cases, the method may include depositing a lubricant over the outer surface of the carbon overcoat after exposing the carbon overcoat layer to the water in gas phase.

13 Claims, 7 Drawing Sheets

CARBON OVERCOAT SURFACE TREATMENT

SUMMARY

The present disclosure is directed to methods and systems for treating a carbon overcoat surface. Specifically, the present techniques may support treating a carbon overcoat surface to improve lubricant adhesion and improve the mechanical and thermal robustness of the carbon overcoat layer.

A medium for heat assisted magnetic recording is described. In one embodiment, the medium may include a magnetic recording layer, a carbon overcoat layer deposited on the magnetic recording layer, and a carbon overcoat layer exposed to water in gas phase after the carbon overcoat layer is deposited on the magnetic recording layer.

In one example, a lubricant is deposited over the outer surface of the carbon overcoat that is exposed to the water in gas phase. In some cases, exposing the carbon overcoat layer to the water in gas phase forms a carbon hydroxyl layer on the outer surface of the carbon overcoat layer, wherein the carbon hydroxyl layer bonds to the lubricant deposited over the carbon hydroxyl layer. In some cases, exposing the carbon overcoat layer to the water in gas phase forms a chemical bond between oxygen atoms of the water and carbon atoms of the carbon overcoat layer. In some cases, a dipolar bond forms between the lubricant and the carbon hydroxyl layer.

In one example, the carbon overcoat layer is deposited in an environment with an environmental temperature maintained within a temperature range of about 150 degrees Celsius (C.) to about 250 degrees C. In some cases, the carbon overcoat layer is exposed to the water in gas phase while the environmental temperature is maintained within the temperature range at which the carbon overcoat layer is deposited on the magnetic recording layer.

In one example, depositing the carbon overcoat layer on the magnetic recording layer occurs in an environment comprising a vacuum deposition chamber. In some cases, the carbon overcoat layer is exposed to the water in gas phase while the medium remains in the vacuum deposition chamber after depositing the carbon overcoat layer on the magnetic recording layer. In some cases, the outer layer of the carbon overcoat layer being exposed to the water in gas phase is based at least in part on a source of purified water being attached to the vacuum deposition chamber via a valve or mass flow device connected to the vacuum deposition chamber, an equilibrium vapor pressure of the water being allowed to expose the deposited carbon overcoat layer to the water in gas phase.

A method for heat assisted magnetic recording is also described. In one embodiment, the method may include depositing a magnetic recording layer over a substrate, depositing a carbon overcoat layer over the magnetic recording layer, and exposing a carbon overcoat layer to water in gas phase after the carbon overcoat layer is deposited on the magnetic recording layer.

A deposition apparatus for forming a storage medium for heat assisted magnetic recording is also described. In one embodiment, the deposition apparatus may be configured to deposit certain layers of a storage medium in a vacuum deposition chamber. In one example, the deposition apparatus may deposit a magnetic recording layer over a substrate, deposit a carbon overcoat layer over the magnetic recording layer, and expose a carbon overcoat layer to water in gas phase after the carbon overcoat layer is deposited on the magnetic recording layer.

The foregoing has outlined rather broadly the features and technical advantages of examples according to this disclosure so that the following detailed description may be better understood. Additional features and advantages will be described below. The conception and specific examples disclose may be readily utilized as a basis for modifying or designing other structures for carrying out the same purposes of the present disclosure. Such equivalent constructions do not depart from the scope of the appended claims. Characteristics of the concepts disclose herein, including their organization and method of operation, together with associated advantages will be better understood from the following description when considered in connection with the accompanying figures. Each of the figures is provided for the purpose of illustration and description only, and not as a definition of the limits of the claims.

BRIEF DESCRIPTION OF THE DRAWINGS

A further understanding of the nature and advantages of the present disclosure may be realized by reference to the following drawings. In the appended figures, similar components or features may have the same reference label. Further, various components of the same type may be distinguished by following a first reference label with a dash and a second label that may distinguish among the similar components. However, features discussed for various components, including those having a dash and a second reference label, apply to other similar components. If only the first reference label is used in the specification, the description is applicable to any one of the similar components having the same first reference label irrespective of the second reference label.

DETAILED DESCRIPTION

The following relates generally to treating a carbon overcoat (COC) surface. The present techniques include various devices that may be used for magnetic recording of data (e.g., heat assisted magnetic recording (HAMR), etc.). Specifically, the present techniques may support treating a COC surface to improve lubricant adhesion and improve the mechanical and thermal robustness of the COC layer.

On a conventional storage medium, nitrogenation allows lubricant to stick to the COC layer to prevent accumulation of lubricant on the advanced air bearing (AAB). However, under operating conditions of a HAMR storage device the nitrogenation weakens the carbon on the COC layer, resulting in increased carbon accumulation onto and around the near field transducer (NFT) due to the high-temperature of the recording process. Accordingly, the present techniques avoid nitrogenation associated with the storage medium.

In one example, the present techniques include replacing nitrogenation of the COC layer with a process of treating the COC layer with an oxygen-hydrogen (OH) rich layer. In some cases, treating the COC layer with an OH rich layer creates chemical functions on the surface of the COC layer as readily as with nitrogenation, while avoiding using the carbon-weakening nitrogenation. As a result, there is less matter accumulation on the NFT with the present techniques.

In one example, the COC layer is treated with the OH rich layer before depositing the lubricant on the storage medium. In some cases, the present techniques may include treating an upper surface of COC layer to create chemical functions in the upper surface of the COC layer that allow the lubricant to adhere to the storage medium without weakening the upper surface of the COC layer by nitrogenation. Accordingly, replacing a nitrogenation of a top surface of the COC layer (e.g., between the air gap and the COC layer) with a process of treating the COC layer with an OH rich layer avoids matter accumulation on the AAB surface (for which nitrogenation was used), while also avoiding excessive accumulation around the NFT (which nitrogenation caused).

Figure 1:
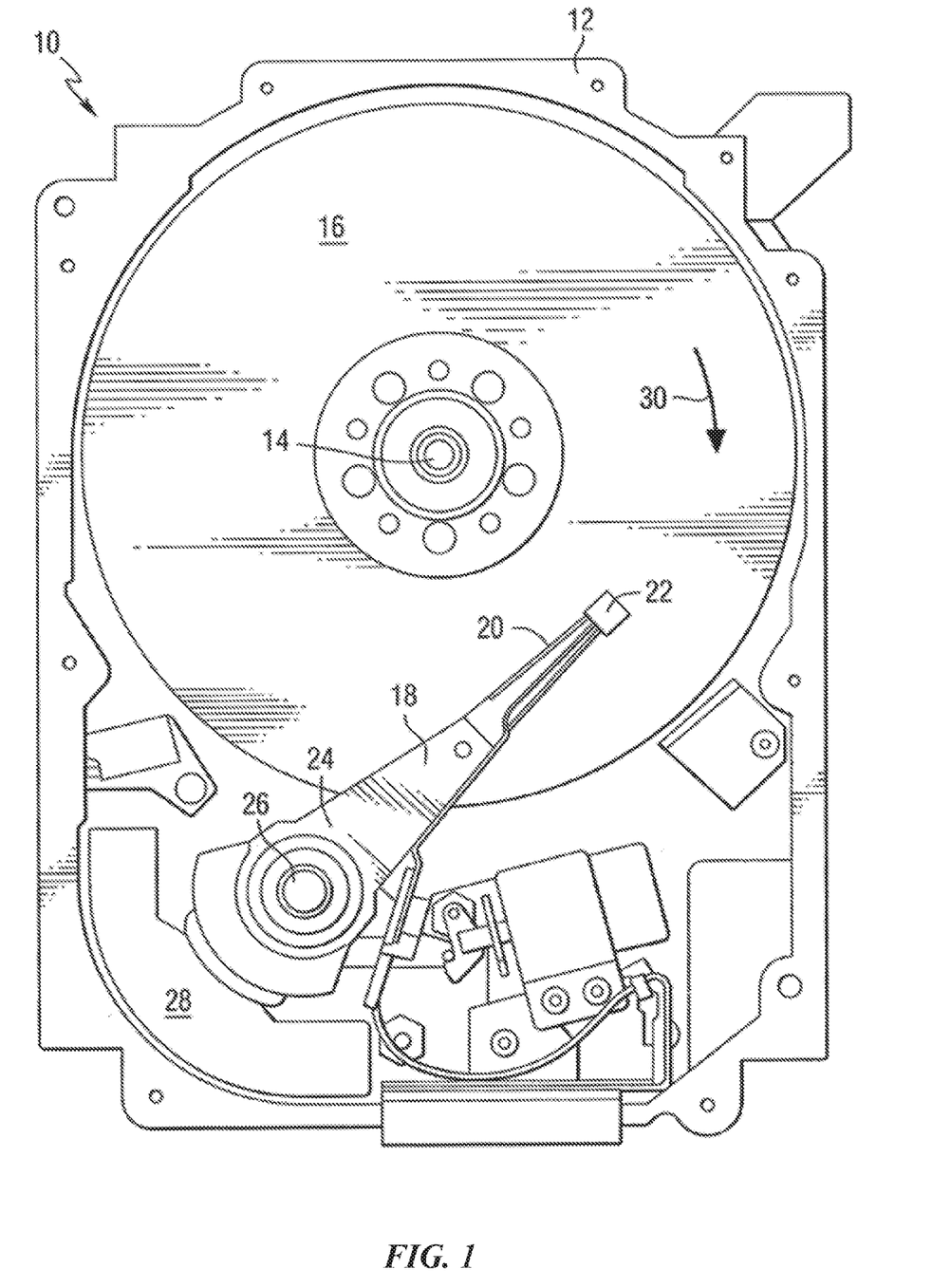
FIG. 1 is a schematic diagram of an example of portion a device in accordance with various aspects of this disclosure.

FIG. 1 depicts a data storage device in an exemplary form of a disk drive 10 including a recording head constructed in accordance with an aspect of the present techniques. The storage device includes a housing 12 (with the upper portion removed and the lower portion visible in this view) sized and configured to contain the various components of the disk drive. The disk drive includes a spindle motor 14 for rotating at least one data storage medium 16 (e.g., a magnetic disk) within the housing. At least one arm 18 may be contained within the housing 12, with each arm 18 having a first end 20 and a second end 24. In some cases, the first end 20 may include a recording head 22 (e.g., recording/writing head, a reading head, a reading/recording head, slider with a reading/recording head, etc.). In some cases, a second end 24 may be pivotally mounted on a shaft by a bearing 26. An actuator motor 28 may be located at the arm's second end 24 for pivoting the arm 18 about a pivot point to position the recording head 22 over a desired sector of the storage medium 16. The actuator motor 28 is controlled by a controller that is not shown in this view and is well-known in the art. The storage medium rotates in the direction indicated by arrow 30. As the disk rotates, recording head 22 may be configured to fly over a surface of storage medium 16 on an air bearing between recording head 22 and the surface of storage medium 16.

For heat assisted magnetic recording (HAMR), an electromagnetic wave of, for example, visible, infrared or ultraviolet light may be directed onto a surface of storage medium 16 to raise the temperature of a localized area on a surface of storage medium 16 to facilitate switching of the magnetization of that area. Some designs of HAMR recording heads include a thin film waveguide on a slider (e.g., slider of recording head 22) to guide light to the storage medium for localized heating of the storage medium. To launch light into the waveguide, a grating coupler may be used.

In some examples, the storage medium 16 may include a magnetic recording layer, a carbon overcoat layer, and a lubricant layer. In some cases, the present techniques include treating the carbon overcoat surface of the storage medium 16 before applying the lubricant. Specifically, the present techniques may include depositing the magnetic recording layer to a substrate of storage medium 16, depositing the carbon overcoat layer over the magnetic recording layer, treating the carbon overcoat surface of storage medium 16 with an oxygen-hydrogen layer, and applying the lubricant over the oxygen-hydrogen layer. In some cases, treating the carbon overcoat surface of storage medium 16 with an oxygen-hydrogen layer improves adhesion of the lubricant to the storage medium 16 (e.g., adhesion of the lubricant to the oxygen-hydrogen layer) and improves the mechanical and thermal robustness of the carbon overcoat layer.

Figure 2:
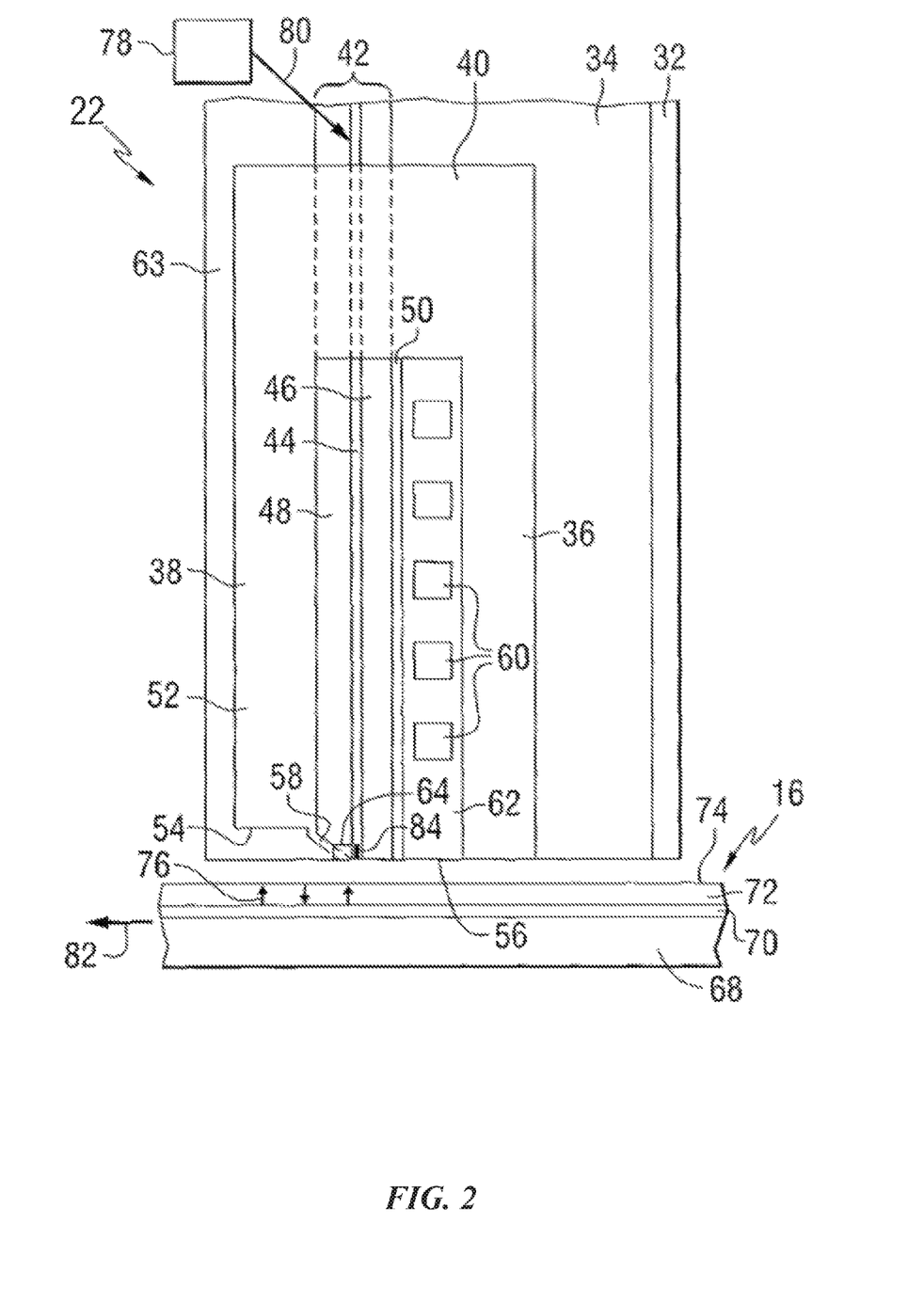
FIG. 2 shows a schematic diagram of a portion of a device in accordance with various aspects of this disclosure.

FIG. 2 is a side elevation view of a recording head 22 constructed in accordance with an aspect of the disclosure, and positioned near storage media. The recording head 22 includes a substrate 32, a base coat 34 on the substrate, a bottom pole 36 on the base coat, and a top pole 38 that may be magnetically coupled to the bottom pole through a yoke or pedestal 40. In the illustrated example, a waveguide 42 may be positioned between the top and bottom poles. The waveguide includes a core layer 44 and cladding layers 46 and 48 on opposite sides of the core layer. A mirror 50 may be positioned adjacent to one of the cladding layers. The top pole may be a two-piece pole that includes a first portion, or pole body 52, having a first end 54 that is spaced from the air bearing surface 56, and a second portion, or sloped pole piece 58 (also referred to as a write pole 58), extending from the first portion and tilted in a direction toward the bottom pole. The second portion may be structured to include an end adjacent to the air bearing surface 56 of the recording head, with the end being closer to the waveguide than the first portion of the top pole. A planar coil 60 may extend between the top and bottom poles and around the pedestal. In the illustrated example, the top pole may serve as a write pole and the bottom pole as a return pole.

In some cases, insulating material 62 may separate the coil turns. In one example, the substrate may be AlTiC, the core layer may be $Ta_2O_5$, and the cladding layers (and other insulating layers) may be $Al_2O_3$. A top layer of insulating material 63 may be formed on the top pole. A heat sink 64 may be positioned adjacent to the sloped pole piece 58. The heat sink may be comprised of a non-magnetic material, such as for example Au.

As illustrated in FIG. 2, the recording head 22 may include a structure for heating the magnetic storage medium 16 proximate to where the write pole 58 applies the magnetic write field H to the storage medium 16. In the illustrated example, the storage medium 16 includes a substrate 68, a heat sink layer 70, a magnetic recording layer 72, and a protective layer 74. However, other types of media, such as bit patterned media may be used. A magnetic field H produced by current in the coil 60 may be used to control the direction of magnetization of bits 76 in the recording layer of the media.

In the example, the storage medium 16 is positioned adjacent to or under the recording head 22. The waveguide 42 conducts light from a source 78 of electromagnetic radiation, which may be, for example, ultraviolet, infrared, or visible light. The source may be, for example, a laser diode, or other suitable laser light source for directing a light beam 80 toward the waveguide 42. Various techniques that are known for coupling the light beam 80 into the waveguide 42 may be used. Once the light beam 80 is coupled into the waveguide 42, the light propagates through the waveguide 42 toward a truncated end of the waveguide 42 that is formed adjacent the air bearing surface (ABS) of the recording head 22. Light exits the end of the waveguide and heats a portion of the media, as the media moves relative to the recording head as shown by arrow 82. A near-field transducer (NFT) 84 is positioned in or adjacent to the waveguide and at or near the air bearing surface. The heat sink material may be chosen such that it does not interfere with the resonance of the NFT.

Although the example of FIG. 2 shows a perpendicular magnetic recording head and a perpendicular magnetic storage media, the present techniques may be used in conjunction with other types of recording heads and/or storage media where it may be desirable to concentrate light to a small spot.

In one example, a carbon overcoat (COC) layer is deposited over magnetic recording layer 72 and a lubricant is deposited over the COC layer. In some cases, the COC layer is treated with an oxygen-hydrogen (OH) rich layer before depositing the lubricant. In some cases, an upper surface of COC layer is treated with the OH rich layer to create chemical functions in the upper surface of the COC layer that allow the lubricant to adhere to the storage medium 16. Accordingly, treating the COC layer with an OH rich layer avoids matter accumulation on the air bearing surface 56 (for which nitrogenation was used), while also avoiding excessive accumulation around the NFT 84 (which nitrogenation caused).

Figure 3:
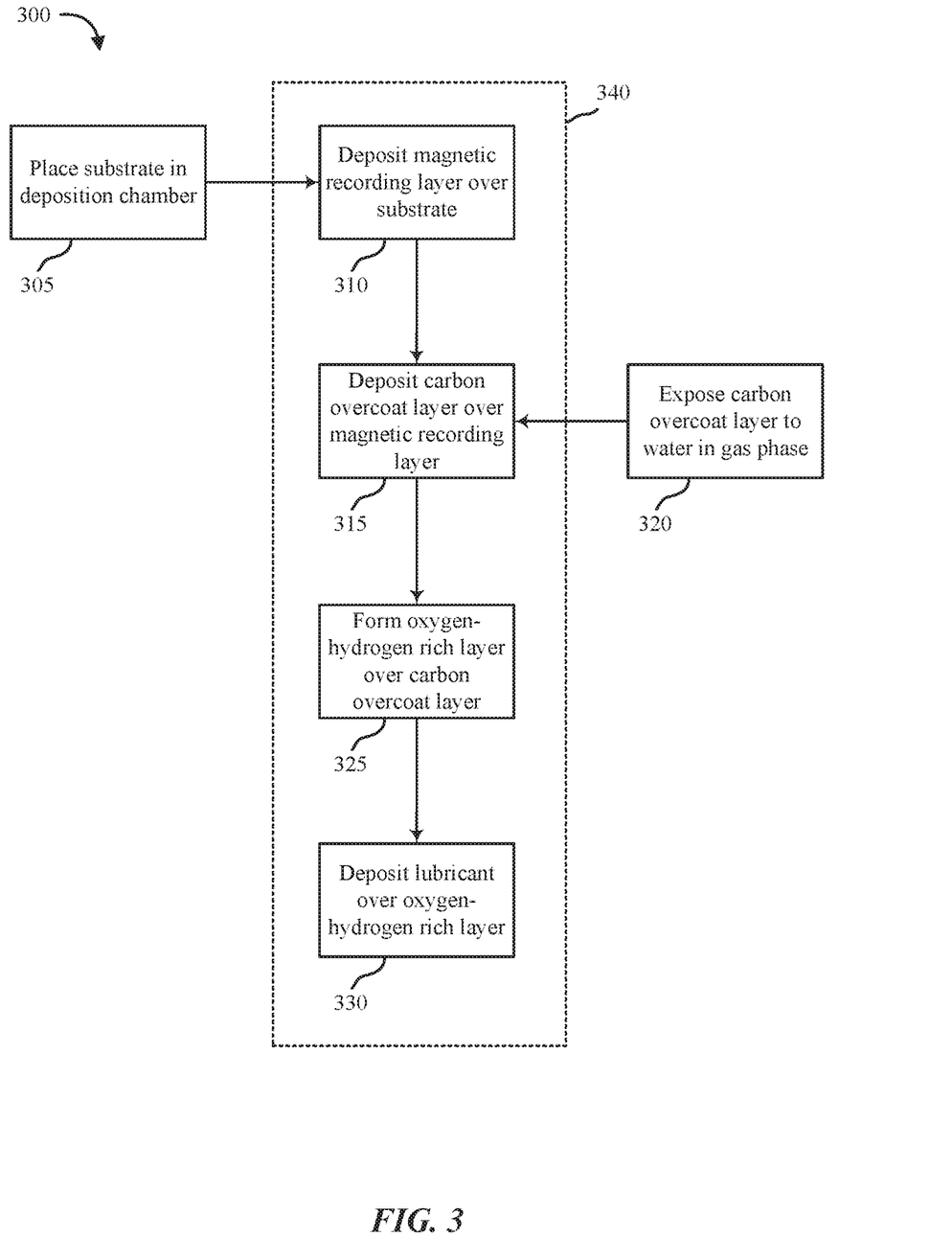
FIG. 3 shows a block diagram of a process in accordance with various aspects of this disclosure.

FIG. 3 shows a block diagram of a process 300 in accordance with various aspects of this disclosure.

At 305, a substrate (e.g., substrate 68) may be placed in a deposition chamber 340 (e.g., sputter deposition chamber, sputtering vapor deposition chamber, pulsed laser deposition chamber, etc.).

At 310, a magnetic recording layer (e.g., magnetic recording layer 72) may be deposited over the substrate within the deposition chamber 340. At 315, a carbon overcoat (COC) layer may be deposited over the magnetic recording layer. In some cases, the same environmental temperature (e.g., a set temperature plus or minus 5 degrees Celsius (C.), a set temperature plus or minus 1 degree C., etc.) may be maintained within deposition chamber 340 while the magnetic recording layer is deposited at 310 and while the COC layer is deposited at 315.

At 320, the COC layer may be exposed to water in gas phase while the substrate with the deposited magnetic recording layer and COC layer remains in the deposition chamber 340. At 325, an oxygen-hydrogen rich layer may be formed over the COC layer based at least in part on the COC layer being exposed to water in gas phase at 320.

At 330, a lubricant may be deposited over the oxygen-hydrogen rich layer deposited at 325. In some cases, the lubricant may be deposited while the substrate with the deposited magnetic recording layer and deposited COC layer exposed to water in gas phase remains in the deposition chamber 340. In some cases, the same environmental temperature may be maintained within deposition chamber 340 while the magnetic recording layer is deposited at 310, while the COC layer is deposited at 315, and while the COC layer is exposed to water in gas phase at 320. Alternatively, a first environmental temperature (e.g., a set temperature within a range of about 150 degrees C. to about 250 degrees C.) may be maintained within deposition chamber 340 while the magnetic recording layer is deposited at 310 and while the COC layer is deposited at 315, and a second environmental temperature different than the first environmental temperature may be maintained within the deposition chamber 340 while the COC layer is exposed to water in gas phase at 320. In some cases, the second environmental temperature may be a set temperature within a range of about 32 degrees C. to about 250 degrees C. In some cases, a lubricant may be deposited over the oxygen-hydrogen rich layer outside of deposition chamber 340.

Figure 4:
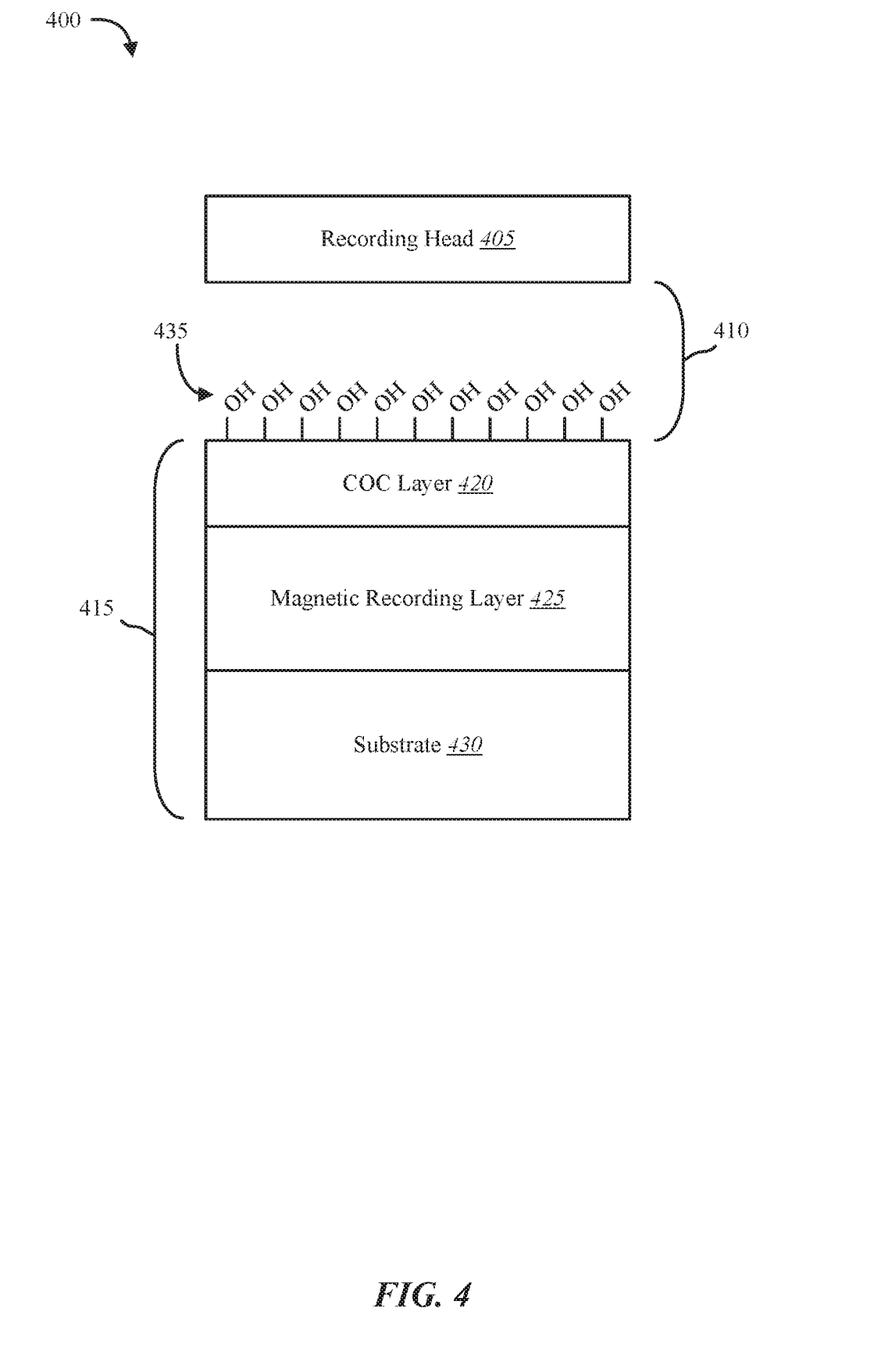
FIG. 4 shows a block diagram of media layers in accordance with various aspects of this disclosure.

FIG. 4 shows a block diagram of environment 400 of a storage device (e.g., disk drive 10 of FIG. 1). Environment 400 may include a recording head 405 (e.g., HAMR recording head), air gap 410 (e.g., air bearing, advanced air bearing, head-to-media spacing, etc.), and a storage medium 415. In some cases, the storage medium 415 may include a carbon overcoat (COC) layer 420, a recording layer 425, and a substrate 430 (e.g., substrate 68). As shown, the recording layer 425 may be deposited on substrate 430. In the illustrated example, recording head 405 may be an example of recording head 22 from FIG. 1 and/or FIG. 2. In some cases, storage medium 415 may be an example of storage medium 16 from FIG. 1 and/or FIG. 2. In some case, recording layer 425 may be an example of magnetic recording layer 72 of FIG. 2.

In some cases, the COC layer 420 may be deposited on recording layer 425 at a relatively high temperature (e.g., 150° to 250° Celsius). In some cases, the COC layer 420 may be deposited using sputter deposition, sputtering vapor deposition, or pulsed laser deposition, etc. In some examples, the COC layer 420 may be exposed to water in gas phase after the COC layer 420 is deposited on the magnetic recording layer 425. As shown, exposing the COC layer 420 to the water in gas phase forms an oxygen-hydrogen layer 435 on the outer surface of the COC layer 420.

Figure 5:
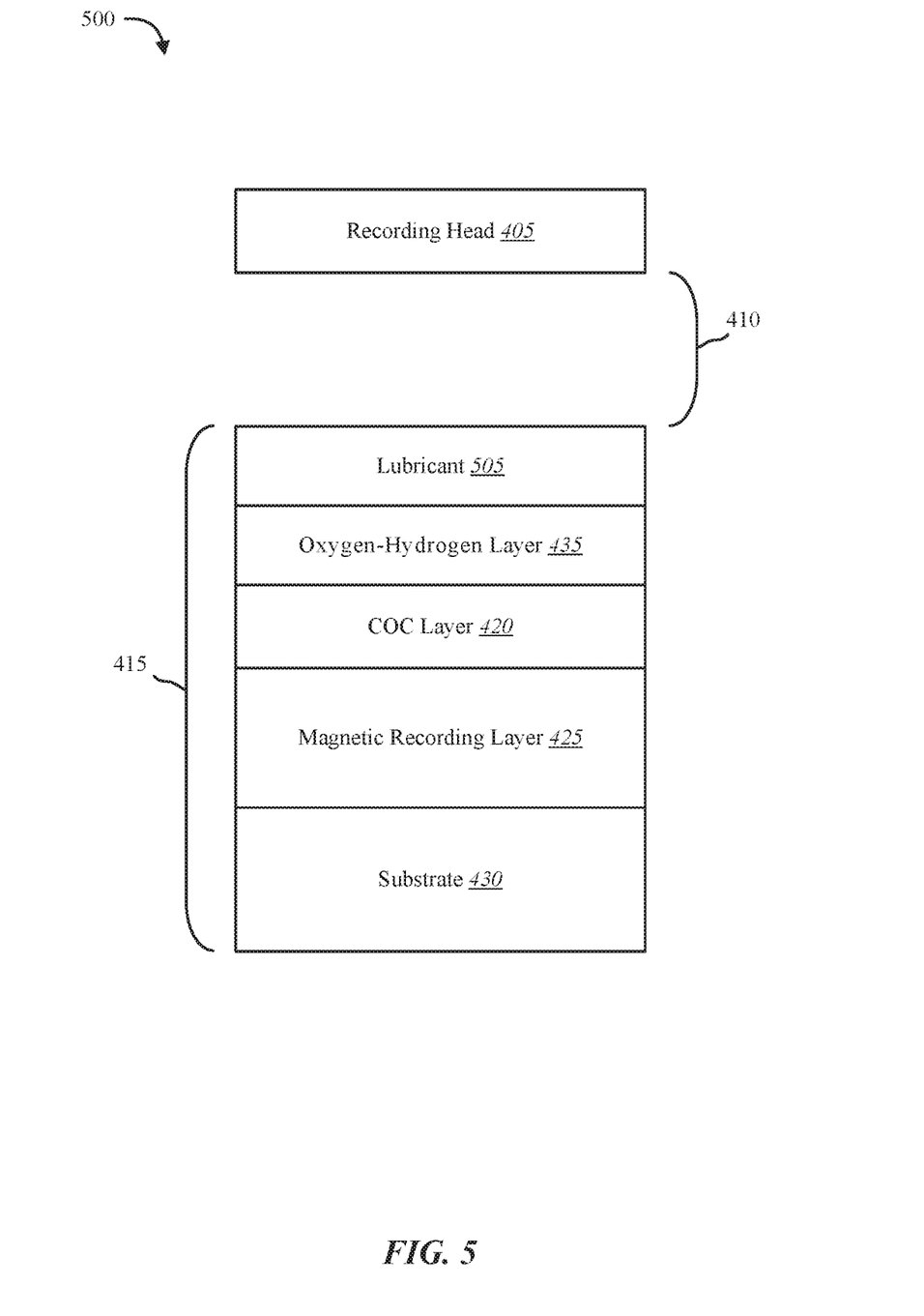
FIG. 5 shows a block diagram of media layers in accordance with various aspects of this disclosure.

FIG. 5 shows a block diagram of environment 500 of a storage device (e.g., disk drive 10 of FIG. 1). Environment 500 may include a recording head 405 (e.g., HAMR recording head), air gap 410 (e.g., air bearing, advanced air bearing, head-to-media spacing, etc.), and storage medium 415. As shown, the storage medium 415 may include a carbon overcoat (COC) layer 420, a recording layer 425, a substrate 430 (e.g., substrate 68), and an oxygen-hydrogen layer 435. As shown, the recording layer 425 may be deposited on substrate 430. In the illustrated example, recording head 405 may be an example of recording head 22 from FIG. 1 and/or FIG. 2. In some cases, storage medium 415 may be an example of storage medium 16 from FIG. 1 and/or FIG. 2. In some case, recording layer 425 may be an example of magnetic recording layer 72 of FIG. 2.

As shown, exposing the COC layer 420 to water in gas phase forms an oxygen-hydrogen layer 435 on the outer surface of the COC layer 420. In some examples, a lubricant 505 is deposited on the oxygen-hydrogen layer 435. In some cases, the oxygen-hydrogen layer 435 bonds to the lubricant 505 deposited over the oxygen-hydrogen layer 435. In some cases, a dipolar bond forms between the lubricant 505 and the oxygen-hydrogen layer 435.

In some examples, exposing the COC layer 420 to the water in gas phase forms a chemical bond between oxygen atoms from the water and carbon atoms from the COC layer 420 at the interface between COC layer 420 and oxygen-hydrogen layer 435. In some cases, exposing the COC layer 420 to water molecules in gas phase replaces carbon-hydrogen (C—H) and carbon-carbon (C═C) functions on the surface of COC layer 420 (e.g., at the interface between COC layer 420 and oxygen-hydrogen layer 435) with carbon hydroxyl (C—OH) functions by reacting the C—H and C═C functions with $H_2O$ molecules in gas phase. In the illustrated example, the C—OH functions of oxygen-hydrogen layer 435 form a relatively strong bond with lubricant 505. For example, lubricant 505 forms a stronger bond with the oxygen-hydrogen layer 435 than lubricant 505 would form with a nitrogenation layer in place of the oxygen-hydrogen layer 435. The relatively strong bond between the oxygen-hydrogen layer 435 and lubricant 505 forms based at least in part on an increased dipolar attraction of the C—OH functions of oxygen-hydrogen layer 435 and lubricant 505 when compared to the nominally deposited carbon overcoat layer with nitrogenation. Also, the relatively strong bond between the oxygen-hydrogen layer 435 and lubricant 505 forms based at least in part on a relatively high surface density of the C—OH function compared to nitrogenation.

One example of present techniques uses the direct exposure of COC layer 420, while COC layer 420 is within a deposition chamber (e.g., vacuum deposition chamber) with a relatively high chamber temperature (e.g., between about 150 degrees C. to about 250 degrees C.), to a flux of $H_2O$ molecules in gas phase. Gas phase $H_2O$ may be added to the deposition chamber in a number of ways. With exposure of the COC layer 420 to $H_2O$, C—H and C=C sites at the surface of COC layer 420 bind with the water and react to create the C—OH function. This reaction creates an OH rich layer (e.g., oxygen-hydrogen layer 435). Each OH function has a relatively large dipolar moment that increases the bonding of lubricant 505 to the surface of COC layer 420.

Several benefits are provided by the present techniques. Some of the benefits include preventing damage to COC layer 420 by avoiding nitrogenation and replacing nitrogenation with an exposure of the COC layer 420 to a flux of $H_2O$ molecules in gas phase to form the oxygen-hydrogen layer 435. Replacing nitrogenation with the oxygen-hydrogen layer 435 results in minimal accumulation (e.g., little to no accumulation) of carbon molecules from COC layer 420 on the near field transducer (NFT). Replacing nitrogenation with the oxygen-hydrogen layer 435 results in a relatively strong dipolar bonding of lubricant 505 to oxygen-hydrogen layer 435. Replacing nitrogenation with the oxygen-hydrogen layer 435 results in minimal accumulation of lubricant molecules from lubricant 505 on an air bearing (e.g., air gap 410, air bearing surface 56, advanced air bearing, etc.). Replacing nitrogenation with the oxygen-hydrogen layer 435 results in a homogeneous layer for lubricant bonding (e.g., lubricant 505 bonding to a surface of oxygen-hydrogen layer 435 adjacent to lubricant 505). Replacing nitrogenation with the oxygen-hydrogen layer 435 results in ease of processing, and unlike nitrogenation, does not require upfront costs of relatively expensive equipment associated with nitrogenation.

Figure 6:
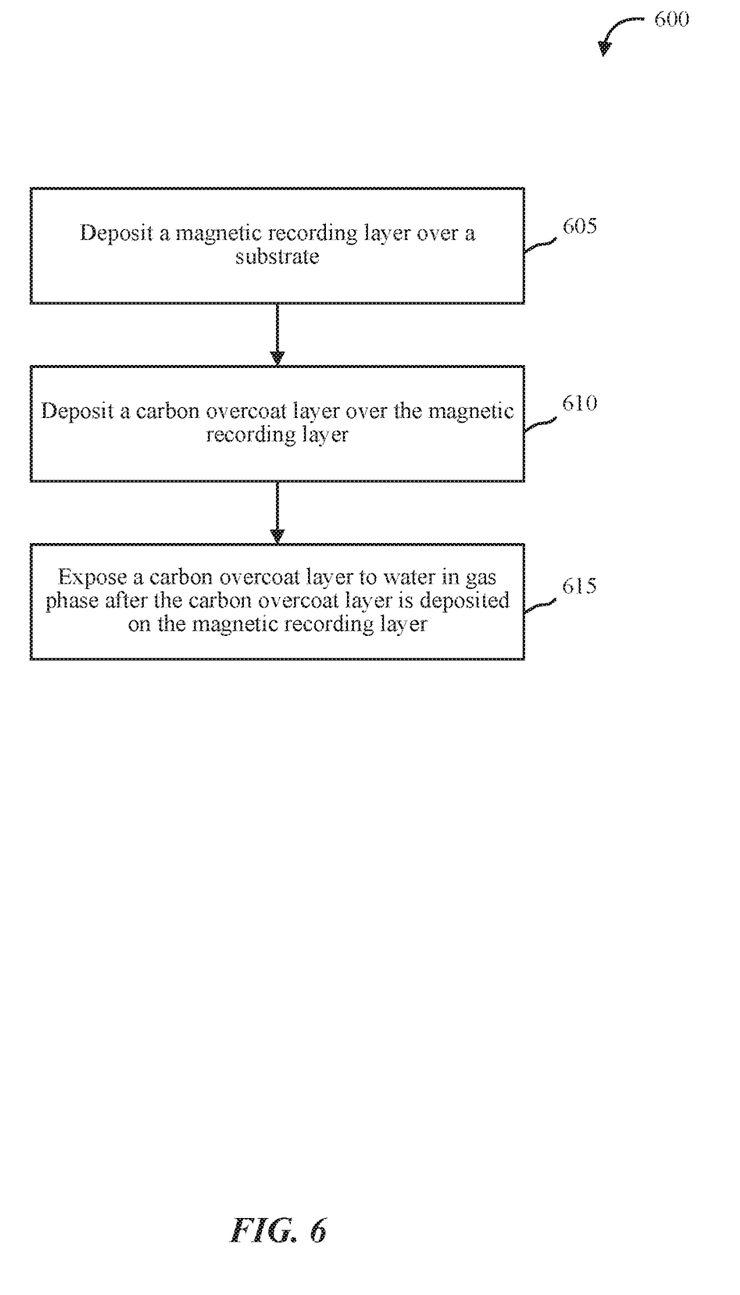
FIG. 6 is a flow chart illustrating an example of a method in accordance with various aspects of this disclosure.

FIG. 6 is a flow chart illustrating an example of a method 600 for treating a carbon overcoat surface, in accordance with various aspects of the present disclosure. One or more aspects of the method 600 may be implemented in conjunction with device 10 of FIG. 1, recording head 22 of FIG. 2, etc.

At block 605, the method 600 may include depositing a magnetic recording layer over a substrate. At block 610, the method 600 may include depositing a carbon overcoat layer over the magnetic recording layer. At block 615, the method 600 may include exposing a carbon overcoat layer to water in gas phase after the carbon overcoat layer is deposited on the magnetic recording layer.

Figure 7:
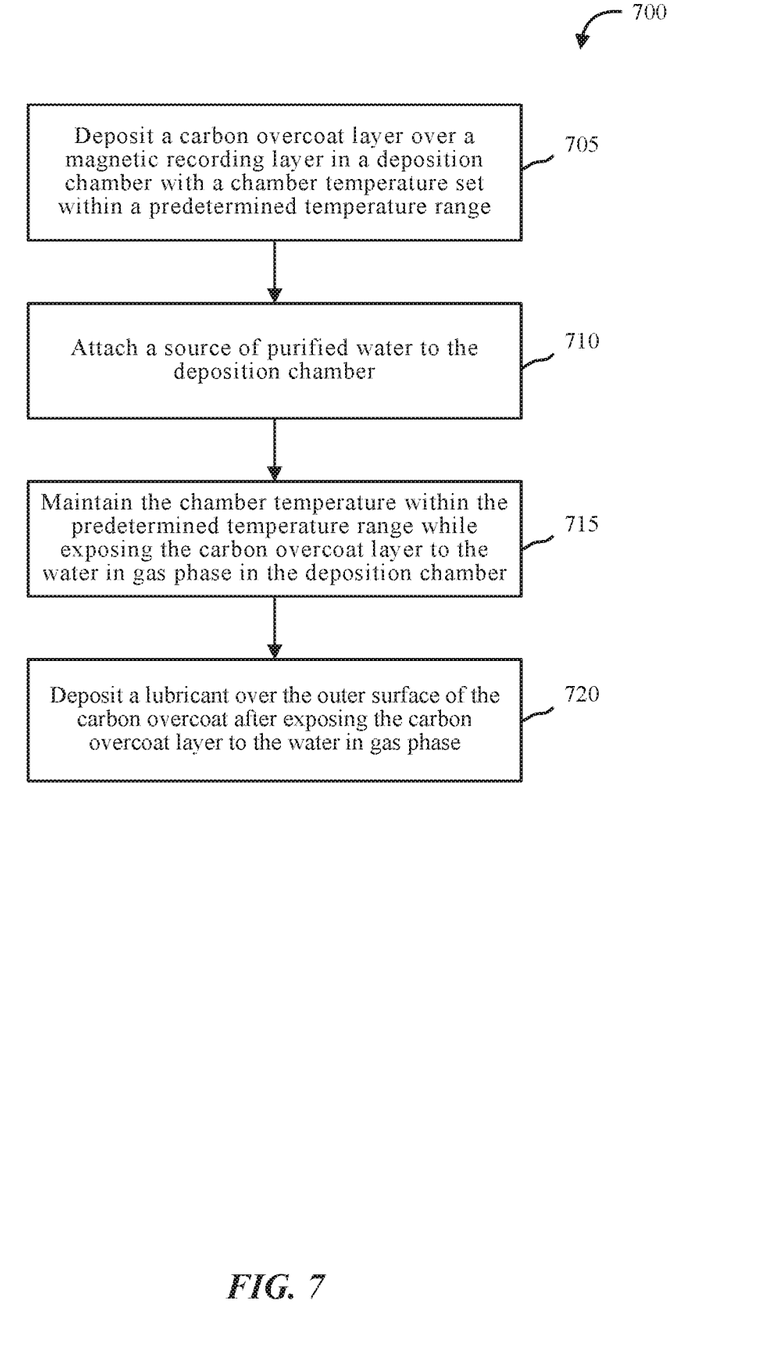
FIG. 7 is a flow chart illustrating an example of a method in accordance with various aspects of this disclosure.

FIG. 7 is a flow chart illustrating an example of a method 700 for treating a carbon overcoat surface, in accordance with various aspects of the present disclosure. One or more aspects of the method 700 may be implemented in conjunction with device 10 of FIG. 1, recording head 22 of FIG. 2, etc.

At block 705, the method 700 may include depositing a carbon overcoat layer over a magnetic recording layer in a deposition chamber with a chamber temperature set within a predetermined temperature range (e.g., about 150 degrees C. to about 250 degrees C.), At block 710, the method 700 may include attaching a source of purified water to the deposition chamber.

At block 715, the method 700 may include maintaining the chamber temperature within the predetermined temperature range while exposing the carbon overcoat layer to the water in gas phase in the deposition chamber.

At block 720, the method 700 may include depositing a lubricant over the outer surface of the carbon overcoat after exposing the carbon overcoat layer to the water in gas phase. In some cases, exposing the carbon overcoat layer to the water in gas phase forms a carbon hydroxyl layer on the outer surface of the carbon overcoat layer. In some cases, the carbon hydroxyl layer bonds to the lubricant deposited over the carbon hydroxyl layer.

It should be noted that the methods 600 and 700 are just example implementations, and that the operations of the methods 600 and 700 may be rearranged or otherwise modified such that other implementations are possible.

The detailed description set forth above in connection with the appended drawings describes examples and does not represent the only instances that may be implemented or that are within the scope of the claims. The terms "example" and "exemplary," when used in this description, mean "serving as an example, instance, or illustration," and not "preferred" or "advantageous over other examples." The detailed description includes specific details for the purpose of providing an understanding of the described techniques. These techniques, however, may be practiced without these specific details. In some instances, known structures and apparatuses are shown in block diagram form in order to avoid obscuring the concepts of the described examples.

Information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and components described in connection with this disclosure may be implemented or performed with a general-purpose processor, a digital signal processor (DSP), an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, and/or state machine. A processor may also be implemented as a combination of computing devices, for example, a combination of a DSP and a microprocessor, multiple microprocessors, one or more microprocessors in conjunction with a DSP core, and/or any combination thereof.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope and spirit of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations.

As used herein, including in the claims, the term "and/or," when used in a list of two or more items, means that any one of the listed items can be employed by itself, or any combination of two or more of the listed items can be employed. For example, if a composition is described as containing components A, B, and/or C, the composition can contain A alone; B alone; C alone; A and B in combination; A and C in combination; B and C in combination; or A, B, and C in combination. Also, as used herein, including in the claims, "or" as used in a list of items (for example, a list of items prefaced by a phrase such as "at least one of" or "one or more of") indicates a disjunctive list such that, for example, a list of "at least one of A, B, or C" means A or B or C or AB or AC or BC or ABC, or A and B and C.

In addition, any disclosure of components contained within other components or separate from other components should be considered exemplary because multiple other architectures may potentially be implemented to achieve the same functionality, including incorporating all, most, and/or some elements as part of one or more unitary structures and/or separate structures.

Computer-readable media includes both computer storage media and communication media including any medium that facilitates transfer of a computer program from one place to another. A storage medium may be any available medium that can be accessed by a general purpose or special purpose computer. By way of example, and not limitation, computer-readable media can comprise RAM, ROM, EEPROM, flash memory, CD-ROM, DVD, or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, or any combination thereof, then the coaxial cable, fiber optic cable, twisted pair, DSL, or wireless technologies such as infrared, radio, and/or microwave are included in the definition of medium. Disk and disk, as used herein, include any combination of compact disk (CD), laser disk, optical disk, digital versatile disk (DVD), floppy disk and Blu-ray disk where disks usually reproduce data magnetically, while disks reproduce data optically with lasers. Combinations of the above are also included within the scope of computer-readable media.

The previous description of the disclosure is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not to be limited to the examples and designs described herein, but is to be accorded the broadest scope consistent with the principles and novel features disclose.

This disclosure may specifically apply to security system applications. This disclosure may specifically apply to storage system applications. In some embodiments, the concepts, the technical descriptions, the features, the methods, the ideas, and/or the descriptions may specifically apply to storage and/or data security system applications. Distinct advantages of such systems for these specific applications are apparent from this disclosure.

The process parameters, actions, and steps described and/or illustrated in this disclosure are given by way of example only and can be varied as desired. For example, while the steps illustrated and/or described may be shown or discussed in a particular order, these steps do not necessarily need to be performed in the order illustrated or discussed. The various exemplary methods described and/or illustrated here may also omit one or more of the steps described or illustrated here or include additional steps in addition to those disclose.

Furthermore, while various embodiments have been described and/or illustrated here in the context of fully functional computing systems, one or more of these exemplary embodiments may be distributed as a program product in a variety of forms, regardless of the particular type of computer-readable media used to actually carry out the distribution. The embodiments disclose herein may also be implemented using software modules that perform certain tasks. These software modules may include script, batch, or other executable files that may be stored on a computer-readable storage medium or in a computing system. In some embodiments, these software modules may permit and/or instruct a computing system to perform one or more of the exemplary embodiments disclose here.

This description, for purposes of explanation, has been described with reference to specific embodiments. The illustrative discussions above, however, are not intended to be exhaustive or limit the present systems and methods to the precise forms discussed. Many modifications and variations are possible in view of the above teachings. The embodiments were chosen and described in order to explain the principles of the present systems and methods and their practical applications, to enable others skilled in the art to utilize the present systems, apparatus, and methods and various embodiments with various modifications as may be suited to the particular use contemplated.

What is claimed is:

1. A method for heat assisted magnetic recording comprising:
   depositing a magnetic recording layer over a substrate;
   depositing a carbon overcoat layer over the magnetic recording layer in a deposition chamber;
   attaching a source of purified water to the deposition chamber via a valve or mass flow device connected to the deposition chamber; and
   exposing the deposited carbon overcoat layer to water in gas phase in the deposition chamber, an equilibrium vapor pressure of the water being allowed to expose the deposited carbon overcoat layer to water in gas phase.

2. The method of claim 1, comprising:
   depositing a lubricant over an outer surface of the carbon overcoat after exposing the carbon overcoat layer to the water in gas phase.

3. The method of claim 2, wherein exposing the carbon overcoat layer to the water in gas phase forms a carbon hydroxyl layer on the outer surface of the carbon overcoat layer, wherein the carbon hydroxyl layer bonds to the lubricant deposited over the carbon hydroxyl layer.

4. The method of claim 3, wherein a dipolar bond forms between the lubricant and the carbon hydroxyl layer.

5. The method of claim 2, wherein exposing the carbon overcoat layer to the water in gas phase forms a chemical bond between oxygen atoms of the water and carbon atoms of the carbon overcoat layer.

6. The method of claim 1, comprising:
depositing the carbon overcoat layer in an environment with an environmental temperature maintained within a temperature range of about 150 degrees Celsius (C.) to about 250 degrees C.; and
maintaining the environmental temperature within the temperature range while depositing the carbon overcoat layer over the magnetic recording layer and while exposing the carbon overcoat layer to the water in gas phase.

7. The method of claim 1, wherein depositing the carbon overcoat layer on the magnetic recording layer occurs in an environment comprising a vacuum deposition chamber.

8. The method of claim 7, wherein exposing the deposited carbon overcoat layer to the water in gas phase further comprises:
attaching the source of purified water to the vacuum deposition chamber via the valve or mass flow device connected to the vacuum deposition chamber.

9. The method of claim 7 further comprising:
attaching the source of purified water to the vacuum deposition chamber; and
exposing the deposited carbon overcoat layer to water in gas phase in the vacuum deposition chamber.

10. A method for heat assisted magnetic recording comprising:
providing a magnetic recording layer on a substrate;
depositing a carbon overcoat layer over the magnetic recording layer in a deposition chamber at a temperature between about 150 degrees Celsius (C.) and about 250 degrees C.;
attaching a source of purified water to the deposition chamber;
exposing the deposited carbon overcoat layer to the purified water in gas phase in the deposition chamber at the temperature forming a carbon hydroxyl layer on the carbon overcoat layer; and
depositing a lubricant over the carbon hydroxyl layer on the carbon overcoat layer.

11. The method of claim 10, wherein a dipolar bond forms between the lubricant and the carbon hydroxyl layer.

12. The method of claim 10, comprising:
attaching the source of purified water to the deposition chamber via a valve or mass flow device connected to the deposition chamber.

13. The method of claim 10, wherein the deposition chamber is a vacuum deposition chamber.

* * * * *